United States Patent
Hamada et al.

(10) Patent No.: US 12,379,428 B2
(45) Date of Patent: Aug. 5, 2025

(54) MAGNETIC FIELD MEASUREMENT APPARATUS AND MAGNETIC FIELD MEASUREMENT METHOD

(71) Applicants: SUMIDA CORPORATION, Tokyo (JP); Kyoto University, Kyoto (JP)

(72) Inventors: Shingo Hamada, Natori (JP); Tsutomu Otsuka, Natori (JP); Yoshiharu Yoshii, Natori (JP); Norikazu Mizuochi, Kyoto (JP); Yuki Takemura, Kyoto (JP)

(73) Assignees: SUMIDA CORPORATION (JP); Kyoto University (JP)

( * ) Notice: Subject to any disclaimer, the term of this patent is extended or adjusted under 35 U.S.C. 154(b) by 151 days.

(21) Appl. No.: 18/560,860

(22) PCT Filed: Mar. 8, 2022

(86) PCT No.: PCT/JP2022/009990
§ 371 (c)(1),
(2) Date: Nov. 14, 2023

(87) PCT Pub. No.: WO2022/244399
PCT Pub. Date: Nov. 24, 2022

(65) Prior Publication Data
US 2024/0255588 A1    Aug. 1, 2024

(30) Foreign Application Priority Data
May 18, 2021    (JP) .................... 2021-084224

(51) Int. Cl.
*G01R 33/00* (2006.01)
*G01R 33/383* (2006.01)
*G01R 33/60* (2006.01)

(52) U.S. Cl.
CPC ........ *G01R 33/0011* (2013.01); *G01R 33/383* (2013.01); *G01R 33/60* (2013.01)

(58) Field of Classification Search
CPC .. G01R 33/0011; G01R 33/383; G01R 33/60; G01R 33/323; G01R 33/26; G01N 24/006
See application file for complete search history.

(56) References Cited

U.S. PATENT DOCUMENTS

| | | | | | |
|---|---|---|---|---|---|
| 5,465,049 | A | * | 11/1995 | Matsuura | G01R 33/0358 324/262 |
| 2009/0295390 | A1 | * | 12/2009 | Hahn | G01R 33/326 324/318 |

(Continued)

FOREIGN PATENT DOCUMENTS

| | | | | |
|---|---|---|---|---|
| CN | 109212440 A | * | 1/2019 | ............. G01R 33/24 |
| JP | H08-75834 | | 3/1996 | |
| JP | 2020-008298 | | 1/2020 | |

OTHER PUBLICATIONS

Fescenko I, Jarmola A, Savukov I, Kehayias P, Smits J, Damron J, Ristoff N, Mosavian N, Acosta VM. Diamond magnetometer enhanced by ferrite flux concentrators. Phys Rev Res. Jun.-Aug. 2020;2(2):023394 (Year: 2020).*

*Primary Examiner* — Daniel R Miller

(57) ABSTRACT

A high-frequency magnetic field generator 2 applies microwave to a magnetic resonance member 1 capable of an electron spin quantum operation using the microwave. A magnet 3 applies a static magnetic field to the magnetic resonance member 1. An irradiating device 12 irradiates the magnetic resonance member 1 with light of a specific wavelength. A flux transformer 4 senses a measurement target magnetic field using a primary coil 4a and applies an application magnetic field corresponding to the sensed measurement target magnetic field to the magnetic resonance member 1 using a secondary coil 4b. Further, the magnetic resonance member 1 is arranged at a position in a hollow part of the secondary coil 4b of the flux transformer 4 and in a hollow part of the magnet 3.

7 Claims, 9 Drawing Sheets

(56) References Cited

U.S. PATENT DOCUMENTS

| | | | |
|---|---|---|---|
| 2010/0090697 A1* | 4/2010 | Savukov | G01R 33/26 |
| | | | 324/309 |
| 2015/0192532 A1* | 7/2015 | Clevenson | G01N 24/006 |
| | | | 324/304 |
| 2017/0343618 A1* | 11/2017 | Hahn | G01R 33/032 |
| 2018/0275211 A1* | 9/2018 | Hahn | G01R 33/0047 |

* cited by examiner

FIG. 8

INDEX #1
(LARGEST VALUE/AVERAGE VALUE OF MAGNETIC FLUX DENSITY STRENGTH)

| INDEX #1 | | OUTER DIAMETER (mm) | | | | |
|---|---|---|---|---|---|---|
| | | 40 | 50 | 60 | 70 | 80 |
| HEIGHT (mm) | 6 | 1.0076 | 1.0052 | 1.0045 | 1.0044 | 1.0044 |
| | 8 | 1.0060 | 1.0050 | 1.0048 | 1.0040 | 1.0034 |
| | 10 | 1.0053 | 1.0051 | 1.0039 | 1.0042 | 1.0043 |
| | 12 | 1.0051 | 1.0044 | 1.0037 | 1.0034 | 1.0030 |
| | 14 | 1.0050 | 1.0041 | 1.0033 | 1.0034 | 1.0035 |

INDEX #2
(SMALLEST VALUE/AVERAGE VALUE OF MAGNETIC FLUX DENSITY STRENGTH)

| INDEX #2 | | OUTER DIAMETER (mm) | | | | |
|---|---|---|---|---|---|---|
| | | 40 | 50 | 60 | 70 | 80 |
| HEIGHT (mm) | 6 | 0.9948 | 0.9959 | 0.9963 | 0.9968 | 0.9971 |
| | 8 | 0.9953 | 0.9961 | 0.9962 | 0.9971 | 0.9971 |
| | 10 | 0.9953 | 0.9963 | 0.9965 | 0.9974 | 0.9971 |
| | 12 | 0.9957 | 0.9965 | 0.9967 | 0.9976 | 0.9975 |
| | 14 | 0.9952 | 0.9969 | 0.9972 | 0.9977 | 0.9976 |

MAGNETIC FIELD MEASUREMENT APPARATUS AND MAGNETIC FIELD MEASUREMENT METHOD

TECHNICAL FIELD

The present invention relates to a magnetic field measurement apparatus and a magnetic field measurement method.

BACKGROUND ART

A magnetic measurement apparatus performs magnetic measurement with ODMR (Optically Detected Magnetic Resonance) that uses electron spin resonance of a sensing member such as a diamond structure that includes a nitrogen and a lattice defect (an NV center: Nitrogen Vacancy Center) (See Patent Literature #1, for example). In ODMR, in addition to a measurement target magnetic field, a static magnetic field is applied to a magnetic resonance member such as a diamond that includes such an NV center; laser light (excitation light and measurement light) and microwave are also applied in accordance with a predetermined) sequence; and a light intensity is detected of fluorescence emitted from the magnetic resonance member and a magnetic flux density is derived on the basis of the light intensity.

For example, in Ramsey Pulse Sequence, (a) an NV Center is irradiated with excitation light, (b) a first pi/2 pulse of microwave is applied to the NV Center, (c) a second pi/2 pulse of microwave is applied to the NV Center with a predetermined time interval tt from the first pi/2 pulse, (d) the NV Center is irradiated with measurement light, and an emitted light intensity of the NV Center is measured, and (e) a magnetic flux density is derived on the basis of the measured light intensity. Further, in Spin Echo Pulse Sequence, (a) an NV Center is irradiated with excitation light, (b) a first pi/2 pulse of microwave is applied to the NV Center at 0-degree phase of a measurement target magnetic field, (c) a pi pulse of microwave is applied to the NV Center at 180-degree phase of the measurement target magnetic field, (d) a second pi/2 pulse of microwave is applied to the NV Center at 360-degree phase of the measurement target magnetic field, (e) the NV Center is irradiated with measurement light, and an emitted light intensity of the NV Center is measured, and (f) a magnetic flux density is derived on the basis of the measured light intensity.

Further, a magnetic sensor includes a superconducting quantum interference device (SQUID), and a magnetic flux transformer (flux transformer) that detects a measurement target magnetic field using a pickup coil and applies the measurement target magnetic field to the SQUID using an input coil (See Patent Literature #2, for example).

CITATION LIST

Patent Literature

PATENT LITERATURE #1: Japanese Patent Application Publication No. 2020-8298.
PATENT LITERATURE #2: Japanese Patent Application Publication No. H8-75834.

SUMMARY OF INVENTION

In the aforementioned magnetic measurement apparatus, the laser light, the microwave, and the static magnetic field are applied to the magnetic resonance member in addition to the measurement target magnetic field, and therefore, respective sets of means for applying the laser light, the microwave, and the static magnetic field are installed around the magnetic resonance member. In order to use a flux transformer when the laser light, the microwave, and the static magnetic field are applied to the magnetic resonance member, a secondary coil of the flux transformer must be arranged without obstructing the application of the laser light, the microwave, and the static magnetic field, and therefore, due to geometrical configuration, it is difficult to effectively apply a magnetic field corresponding to a measurement target magnetic field to a magnetic resonance member.

The present invention has been conceived in view of the aforementioned problem. It is an object of the present invention to obtain a magnetic measurement apparatus and a magnetic measurement method in which a magnetic field corresponding to a measurement target magnetic field is effectively applied to a magnetic resonance member using a flux transformer; a magnetic resonance member, a high-frequency generator, and a magnet are easily arranged relatively to a direction of a magnetic flux of the flux transformer; and a space for irradiation of the laser light can be easily secured.

A magnetic field measurement apparatus according to the present invention includes: a magnetic resonance member capable of an electron spin quantum operation using microwave; a high-frequency magnetic field generator that applies the microwave to the magnetic resonance member; a magnet that applies a static magnetic field to the magnetic resonance member; an irradiating device that irradiates the magnetic resonance member with light of a specific wavelength; and a flux transformer that senses a measurement target magnetic field using a primary coil and applies an application magnetic field corresponding to the sensed measurement target magnetic field to the magnetic resonance member using a secondary coil. Further, the magnetic resonance member is arranged at a position in a hollow part of the secondary coil of the flux transformer and in a hollow part of the magnet.

A magnetic field measurement method according to the present invention includes the steps of: (a) sensing a measurement target magnetic field using a primary coil of a flux transformer, (b) applying an application magnetic field to a magnetic resonance member capable of an electron spin quantum operation using microwave, the application magnetic field corresponding to the sensed measurement target magnetic field using a secondary coil of the flux transformer; applying the microwave to the magnetic resonance member; applying a static magnetic field to the magnetic resonance member; and irradiating the magnetic resonance member with light of a specific wavelength. Further, the magnetic resonance member is arranged at a position in a hollow part of the secondary coil of the flux transformer and in a hollow part of the magnet.

Advantageous Effect of Invention

By means s of the present invention, obtained are a magnetic measurement apparatus and a magnetic measurement method in which a magnetic field corresponding to a measurement target magnetic field is effectively applied to a magnetic resonance member using a flux transformer; a magnetic resonance member, a high-frequency generator, and a magnet are easily arranged relatively to a direction of a magnetic flux of the flux transformer; and a space for irradiation of the laser light can be easily secured.

BRIEF DESCRIPTION OF DRAWINGS

FIG. 8 shows a diagram that explains an example of a magnetic flux density characteristic at the magnetic resonance member 1 by the magnet 3 shown in FIG. 4 (2/2)

DESCRIPTION OF EMBODIMENTS

Hereinafter, an embodiment according to aspects of the invention will be explained with reference to a present drawing.

Figure 1:
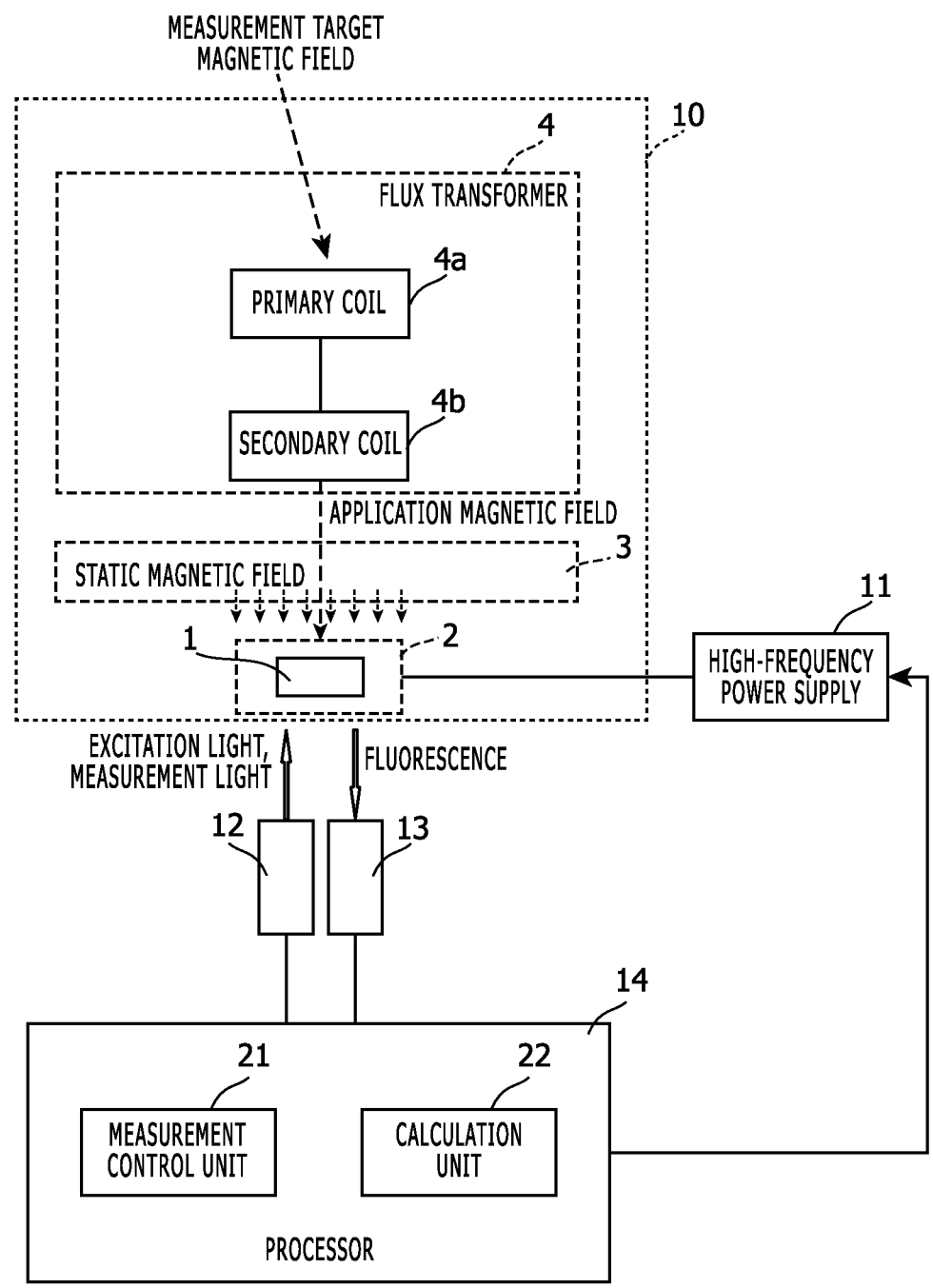
FIG. 1 shows block diagram that indicates a configuration of a magnetic field measurement apparatus according to an embodiment of the present invention.

FIG. 1 shows a block diagram that indicates a configuration of a magnetic field measurement apparatus according to an embodiment of the present invention. The magnetic field measurement apparatus shown in FIG. 1 includes a magnetic sensor part 10, a high-frequency power supply 11, an irradiating device 12, a light receiving device 13, and a processor 14.

The magnetic sensor part 10 detects a measurement target magnetic field (e.g. an intensity, a direction, and/or the like) at a predetermined position (e.g. on or over a surface of a test target object). The measurement target magnetic field may be an AC (Alternating Current) magnetic field of a single frequency or an AC magnetic field that includes plural frequency components and has a predetermined period.

In this embodiment, the magnetic sensor part 10 includes a magnetic resonance member 1, a high-frequency magnetic field generator 2, a magnet 3, and a flux transformer 4.

The magnetic resonance member 1 is a member that includes a crystal structure and is capable of electron spin quantum operations (based on Rabi oscillation) with microwave of a frequency corresponding to arrangement orientations of a vacancy and an impurity in a crystal lattice.

In this embodiment, the magnetic resonance member 1 is an optically detected magnetic resonance member that includes plural specific color centers (i.e. color center ensemble). Each of the plural specific color centers has a Zeeman-splittable energy level and can take plural orientations of which energy level shift amounts due to Zeeman splitting are different from each other.

Here the magnetic resonance member 1 is a member such as a diamond including plural NV (Nitrogen Vacancy) centers as specific color centers of a single type. In the NV center, the ground level is a triplet level of Ms=0, +1, −1, and levels of Ms=+1 and Ms=−1 are Zeeman-splittable. It should be noted that color centers included in the magnetic resonance member 1 may be color centers other than NV centers.

The high-frequency magnetic field generator 2 applies the aforementioned microwave to the magnetic resonance member 1. Here, the high-frequency magnetic field generator 2 is a plate coil, and includes a coil part 2a of a substantially circular shape that outputs microwave, and terminal parts 2b that extend from both ends of the coil part and are fixed to a substrate 31. The high-frequency power supply 11 generates a current for the microwave, and causes the high-frequency magnetic field generator 2 to conduct the current.

The coil part 2a of the high-frequency magnetic field generator 2 conducts two flows of current parallel to each other with a predetermined gap on its both end surfaces such that the magnetic resonance member 1 is arranged between the two flows, and thereby outputs the aforementioned microwave. Here, although the high-frequency magnetic field generator 2 is a plate coil, the current flows in end surface parts of the coil part 2a due to skin effect, and thereby the two flows of the current is formed.

Figure 2:
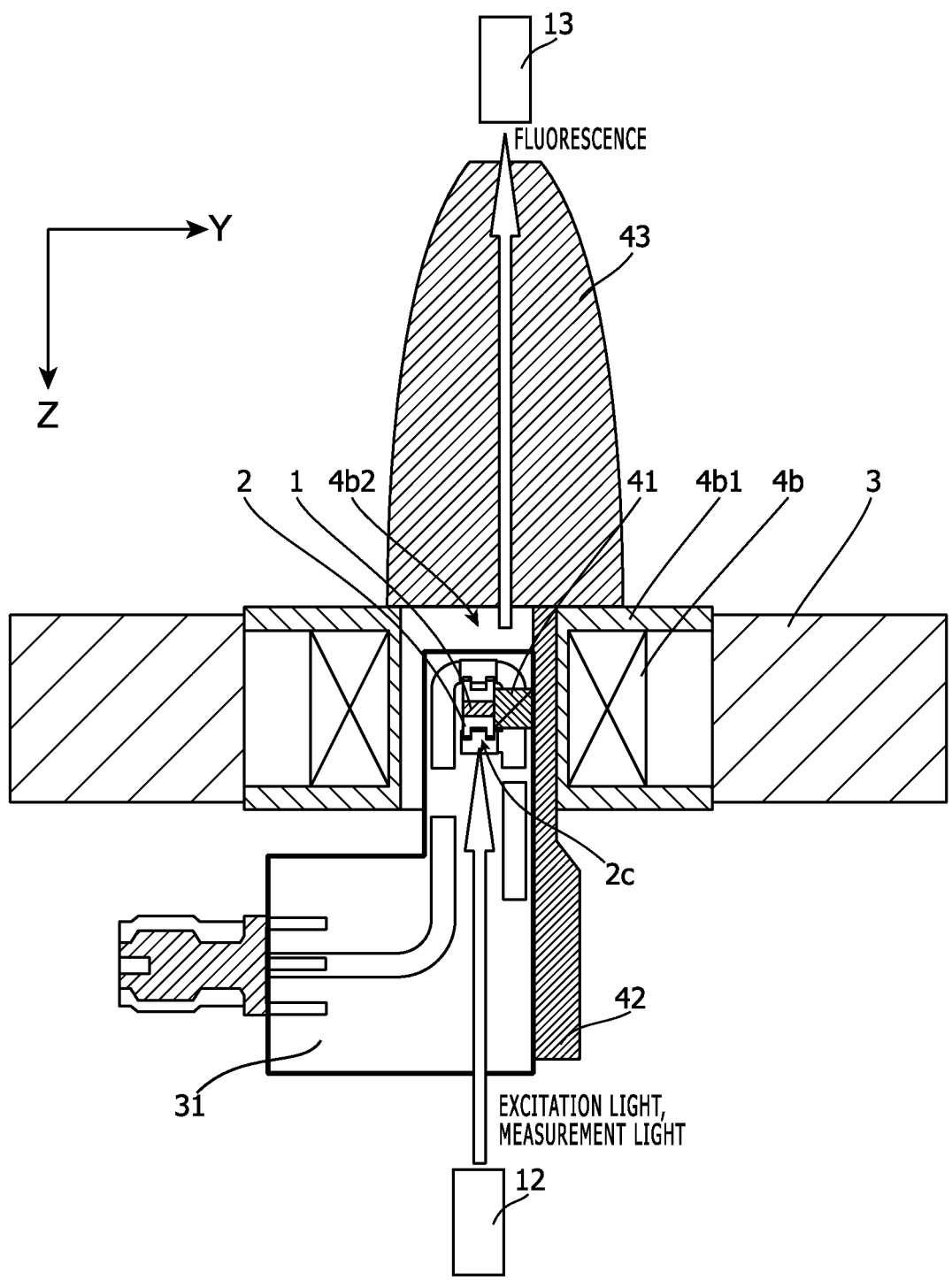
FIG. 2 shows a cross-sectional diagram that indicates an example of a configuration of an optical system in the magnetic sensor part 10 shown in FIG. 1.

FIG. 2 shows a cross-sectional diagram that indicates an example of a configuration of an optical system in the magnetic sensor part 10 shown in FIG. 1. As shown in FIG. 2, for example, opening parts 2c are formed on a side surface of the coil part of a substantially circular and planer shape in the high-frequency magnetic field generator 2, and excitation light and measurement light from the irradiating device 12 pass through the opening part 2c and the magnetic resonance member 1 (a whole area or a part of the magnetic resonance member 1) is irradiated with the excitation light and the measurement light. Sizes of the opening parts 2c are decided on the basis of a size of irradiation area in the magnetic resonance member 1 and a size of an area through which current due to skin effect flows. In this embodiment, the irradiation area in the magnetic resonance member 1 is set to be a rectangular or a circle, and the plate coil of the high-frequency magnetic field generator 2 has a substantial circle shape, and therefore, the opening parts 2c have rectangular shapes curved as circular arc, and the opening parts 2c are designed such that a square measure of a projection area of the opening parts 2c to the magnetic resonance member 1 is larger than a square measure of the irradiation area and the projection area includes the irradiation area.

Further, the magnet 3 applies a static magnetic field (DC magnetic field) to the magnetic resonance member 1 and thereby causes Zeeman splitting of the energy level of the plural specific color centers (here, plural NV centers) in the magnetic resonance member 1. Here, the magnet 3 is a ring-type permanent magnet, for example, a ferrite magnet, an alnico magnet, a samarium-cobalt magnet or the like.

In case of NV center, a color center is formed of a vacancy (hole) (V) and a nitrogen (N) as impurity in a diamond crystal, there are four possible positions (arrangement orientations of the vacancy and the nitrogen) of the nitrogen (N) adjacent to the vacancy (hole) (V) in the diamond crystal, and sub energy levels after Zeeman splitting (i.e. energy levels away from the base energy level) corresponding to these positions (i.e. four arrangement orientation) are different from each other. Therefore, in a characteristic of fluorescence intensities to frequencies of the microwave after Zeeman splitting due to the static magnetic field, four dip frequency pairs (fi+, fi−) corresponding to the orientations i (i=1, 2, 3, 4) appear differently from each other. Here, a frequency (a wavelength) of the aforementioned microwave is set correspondingly to any dip frequency among the four dip frequency pairs.

Figure 3:
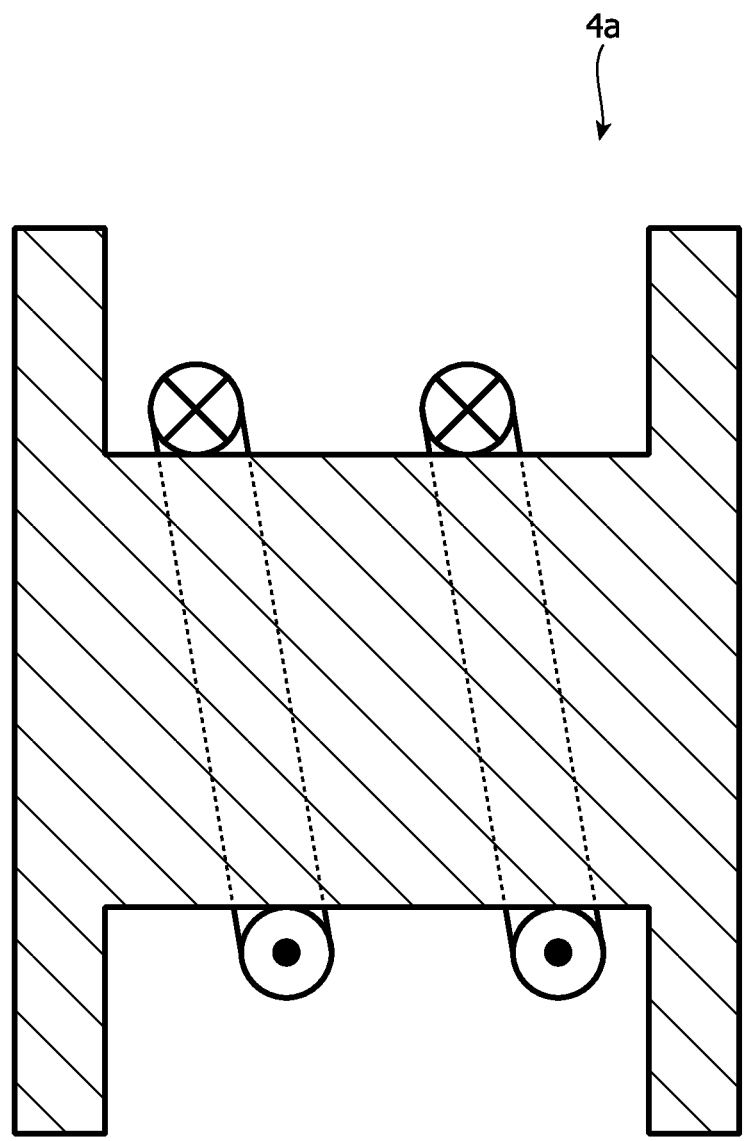
FIG. 3 shows a cross-sectional diagram that indicates a primary coil 4a of a transformer 4 in FIG. 1.

Further, the flux transformer 4 includes a primary coil 4a, and a secondary coil 4b that is electrically connected to the primary coil 4a through a cable (coaxial cable, litz wires, or the like) or the like. As shown in FIG. 3, the primary coil 4a is configured with a winding wire of 0.5 turn to tens of turns. Further, as shown in FIG. 3, a measurement target magnetic field is sensed using the primary coil 4a at a predetermined measurement position, and an application magnetic field corresponding to the measurement target magnetic field sensed at the predetermined measurement position (a magnetic field transmitted from the predetermined measurement position by the flux transformer 4) is applied to the magnetic resonance member 1 using the secondary coil 4b. Thus, the primary coil 4a induces an electric signal corresponding to the sensed measurement target magnetic field, and the secondary coil 4b induces the application magnetic field corresponding to this electric signal.

Figure 4:
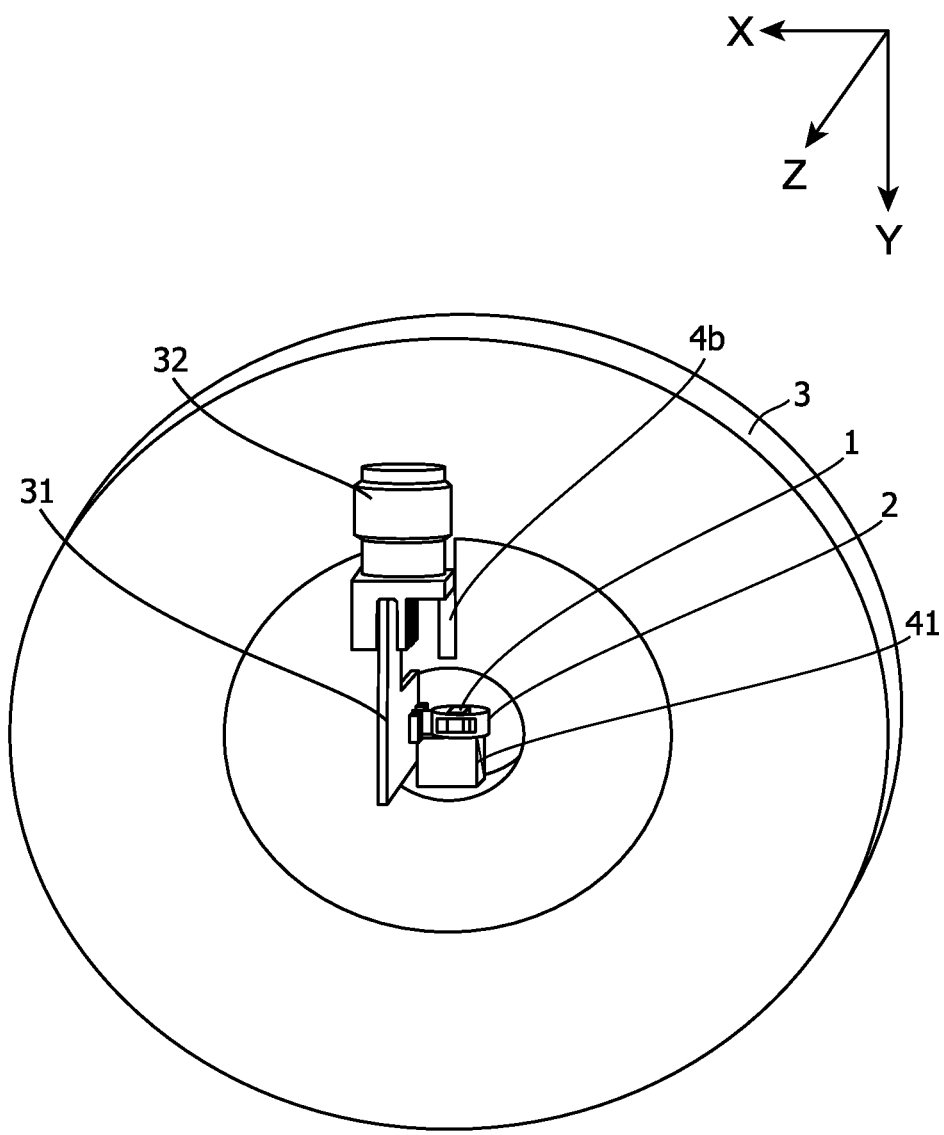
FIG. 4 shows a perspective-view diagram that indicates an example of a configuration of a magnetic sensor part 10 in the magnetic field measurement apparatus shown in FIG. 1.
Figure 5:
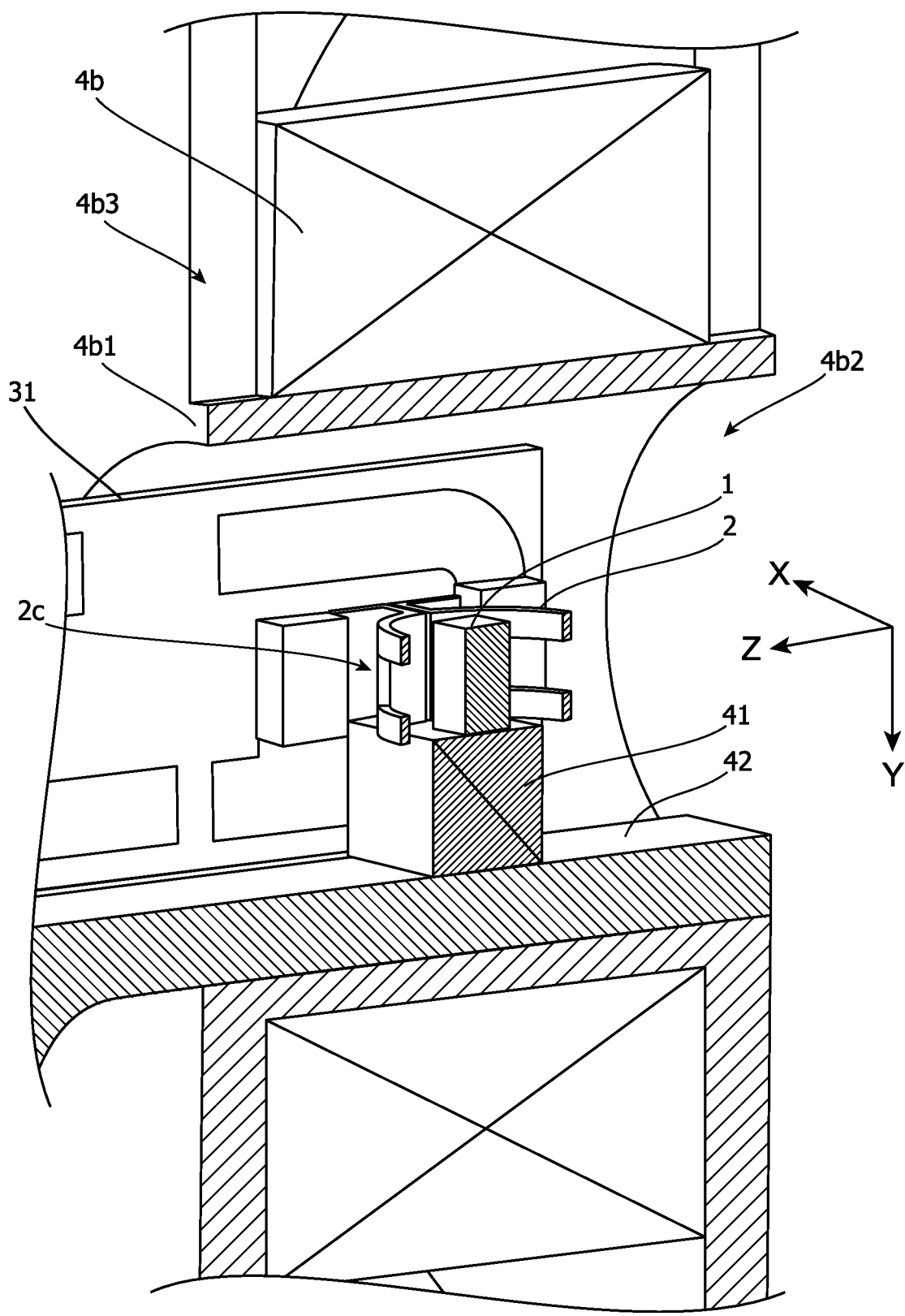
FIG. 5 shows a cross-sectional diagram (of Y-Z plane) that indicates arrangement a magnetic resonance member 1, a high-frequency magnetic field generator 2, a secondary coil 4b and the like in the magnetic sensor part 10 shown in FIG. 4.
Figure 6:
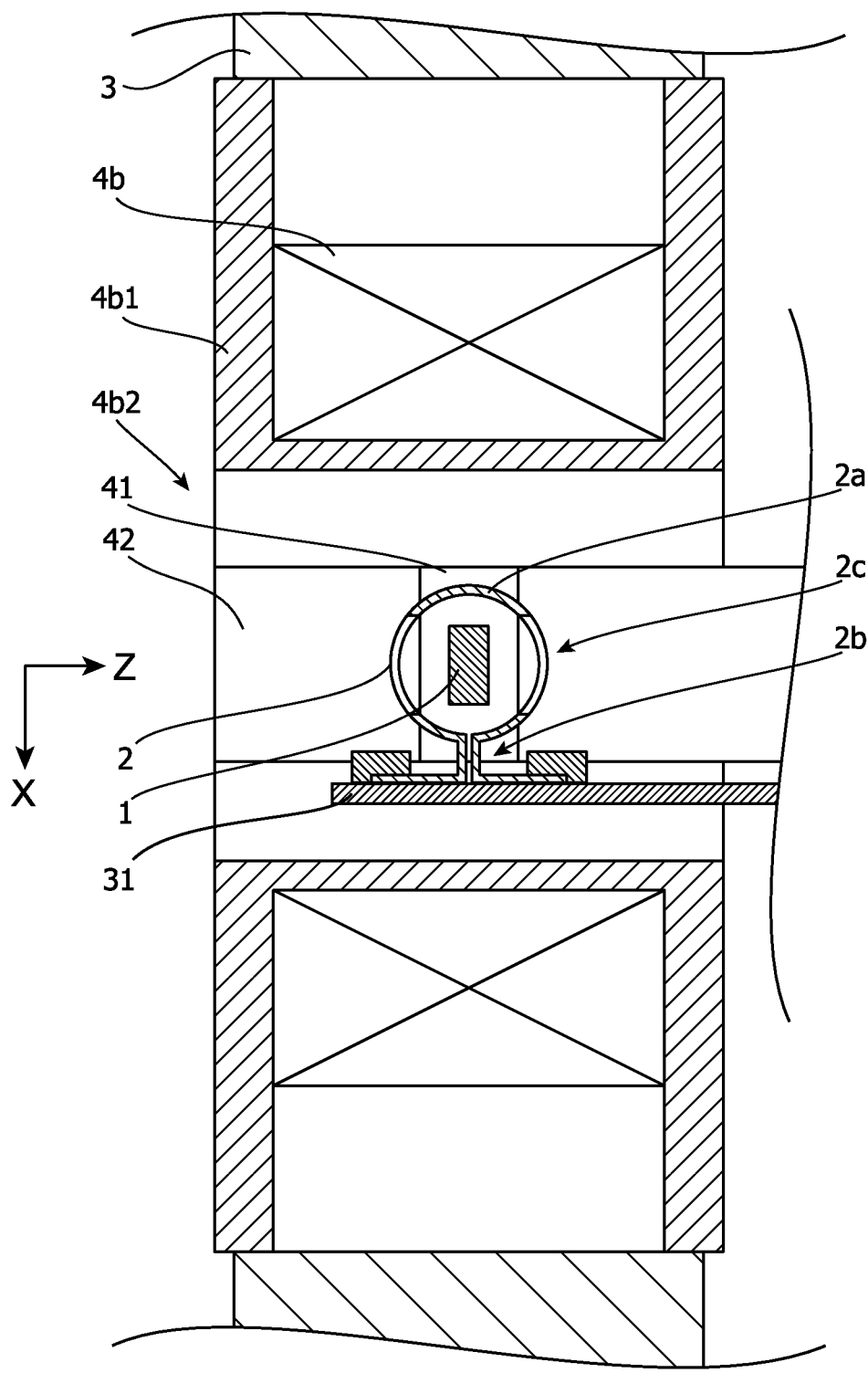
FIG. 6 shows a cross-sectional diagram (of X-Z plane) that indicates arrangement a magnetic resonance member 1, a high-frequency magnetic field generator 2, a secondary coil 4b and the like in the magnetic sensor part 10 shown in FIG. 4.

FIG. 4 shows a perspective-view diagram that indicates an example of a configuration of a magnetic sensor part 10 in the magnetic field measurement apparatus shown in FIG. 1. FIG. 5 shows a cross-sectional diagram (of Y-Z plane) that indicates arrangement a magnetic resonance member 1, a high-frequency magnetic field generator 2, a secondary coil 4b and the like in the magnetic sensor part 10 shown in FIG. 4. FIG. 6 shows a cross-sectional diagram (of X-Z plane) that indicates arrangement a magnetic resonance member 1, a high-frequency magnetic field generator 2, a secondary coil 4b and the like in the magnetic sensor part 10 shown in FIG. 4.

For example, as shown in FIGS. 4 to 6, the aforementioned magnetic resonance member 1 is arranged at a position in a hollow part of the secondary coil 4 of this flux transformer 4 and in a hollow part of the magnet 3.

In this embodiment, the secondary coil 4b is arranged in the hollow part of the magnet 3. Specifically, the magnet 3 is a ring-type magnet, the secondary coil 4b is winded uniformly as a ring shape, and in respective transverse sections perpendicular to the center axis of the magnet 3 and the center axis of the secondary coil 4b, the magnetic resonance member 1 is arranged in a center area of a radius (=a radius of the transverse section×a %) from its center point. In particular, it is favorable that the magnetic resonance member 1 is arranged at the center point. Here, the "a" is equal to or less than 30, more favorably equal to or less than 20, further more favorably equal to or less than 10, more favorably equal to or less than 5.

Therefore, in this embodiment, an application direction of the aforementioned application magnetic field is identical to an application direction of the aforementioned static magnetic field, and applying the aforementioned static magnetic field gains fluorescence intensity variation at the aforementioned dip frequency and results in a high sensitivity.

Further, in this embodiment, the secondary coil 4b is winded so as to get a ring shape around the nonmagnetic bobbin 4b1 with a predetermined turn ratio to the primary coil 4a. In the bobbin 4b1, a hollow part 4b2 (i.e. the hollow part of the secondary coil 4b) and a slit 4b3 for a winding wire exit are formed.

Further, in this embodiment, the magnetic resonance member 1 includes plural color centers (here, NV centers) capable of electron spin quantum operations with the aforementioned microwave, and the 3 magnet applies a substantially uniform static magnetic field to a predetermined area (an irradiation area of the excitation light and the measurement light) of the magnetic resonance member 1. For example, the static magnetic field is applied such that in the predetermined area a difference or a ratio between a maximum value and a minimum value of intensity of the static magnetic field gets equal to or less than a predetermined value.

Further, in a direction of the center axis of the magnet 3, the magnetic resonance member 1 is arranged in a "center section" of a width of the ring-type magnet 3. Here, this "center section" means a space within ±(its center-axis length ½×b %) along Z direction in FIG. 6 (the axis direction) of the ring-type magnet 3 from a center point of the center axis. Here, the "b" is equal to or less than 30, more favorably equal to or less than 20, further more favorably equal to or less than 10, more favorably equal to or less than 5. Further, in this embodiment, the magnetic resonance member 1 is arranged at a center of a width of the ring-type magnet 3 (i.e. the magnetic resonance member 1 is arranged at a position of substantially same distances from both end surfaces of the magnet 3). Furthermore, in a direction of the center axis of the secondary coil 4b, the magnetic resonance member 1 is arranged in a "center section" of a width of the secondary coil 4b. Here, the "center section" means a space within +(its center-axis length ½×c %) along Z direction in FIG. 6 (the axis direction) of the secondary coil 4b from a center point of the center axis. Here, the "c" is equal to or less than 30, more favorably equal to or less than 20, further more favorably equal to or less than 10, more favorably equal to or less than 5. Furthermore, in this embodiment, the magnetic resonance member 1 is arranged at a center of a width of the secondary coil 4b (i.e. the magnetic resonance member 1 is arranged at a position of substantially same distances from both end surfaces of the secondary coil 4b). Furthermore, it is favorable that in a plane perpendicular to the center axis of the hollow part of the magnet 3, a square measure of a cross section of this hollow part is equal to or larger than hundred times of a square measure of the irradiation area of the excitation light and the measurement light in the magnet resonance member 1; and in particular, it is favorable that a radius of the cross section of this hollow part is equal to or larger than ten times of a radius of the irradiation area of the measurement light. In this embodiment, the irradiation area of the measurement light has a size of 50 micro meters by 100 micro meters, and a cross section of the hollow part has a size of 500 micro meters by 1000 micro meters or larger. In the aforementioned manner, a uniform static magnetic field (a static magnetic field of substantial constant direction and intensity) is applied to the irradiation area of the excitation light and the measurement light.

Figure 7:
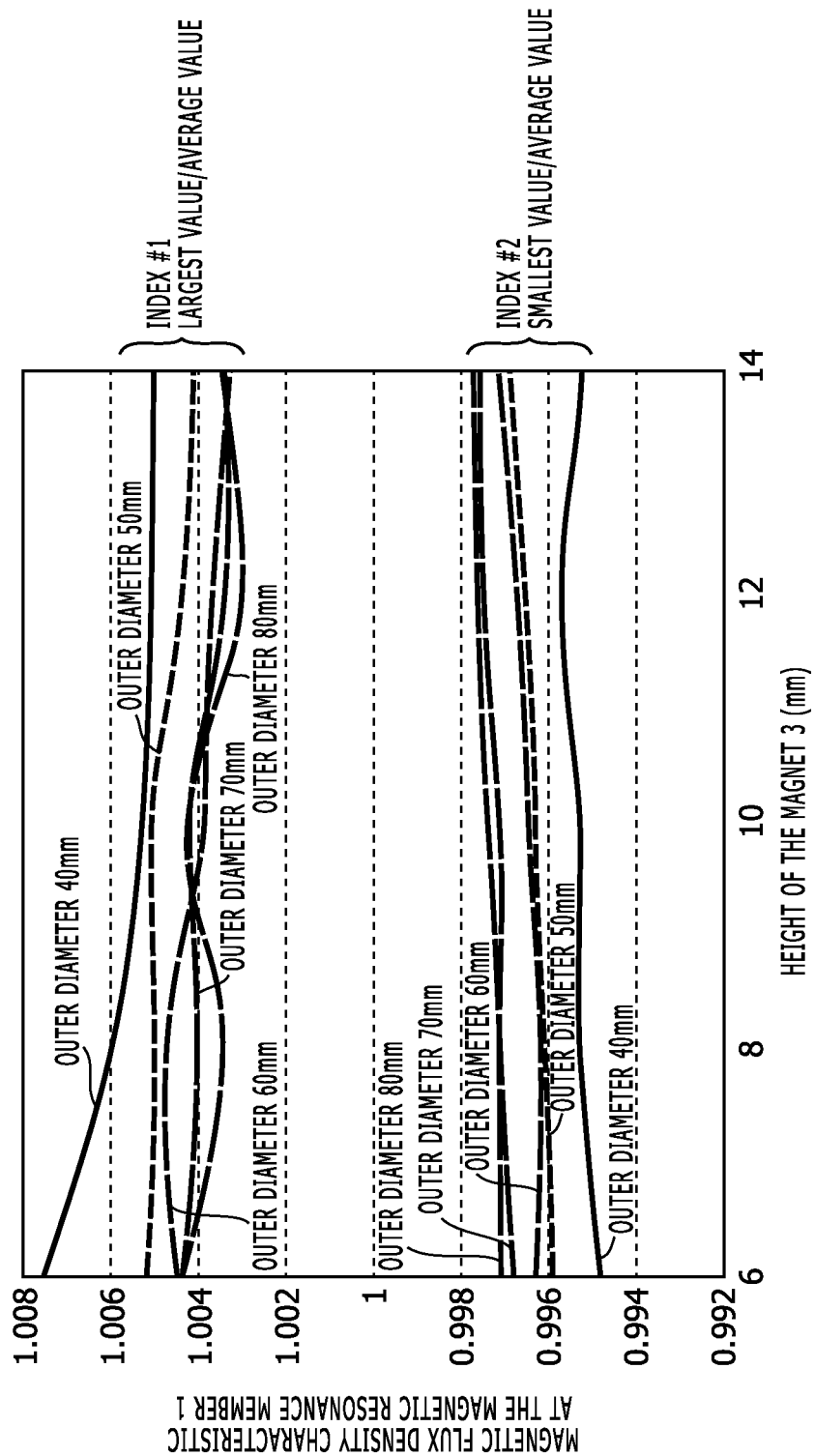
FIG. 7 shows a diagram that explains an example of a magnetic flux density characteristic at the magnetic resonance member 1 by the magnet 3 shown in FIG. 4 (1/2)

FIGS. 7 and 8 show diagrams that explain examples of a magnetic flux density characteristic at the magnetic resonance member 1 by the magnet 3 shown in FIG. 4. FIGS. 7 and 8 show a magnetic flux density characteristic in a case that sizes of the magnetic resonance member 1 is 2 mm by 2 mm by 1 mm and the magnet 3 is a ferrite magnet that has an inner diameter of 30 mm, a remanence of 385 mT, and a relative permeability of 1.15, and indicates Index #1 (a ratio between a largest value and an average value of a magnetic flux density strength in the aforementioned area) and Index #2 (a ratio between a smallest value and an average value of a magnetic flux density strength in the aforementioned area) for changed outer diameters and heights of the magnet 3 and this magnetic flux density characteristic is obtained by simulation. As shown in FIGS. 7 and 8, when the outer diameter and the height (thickness) of the magnet 3 are properly designed, a deviation of a magnetic flux density at the magnetic resonance member 1 can be substantially 0.5% or less.

Further, a crystal in the magnetic resonance member 1 is formed and an orientation of the magnetic resonance member 1 is set, so as to cause an arrangement direction of the aforementioned vacancy and impurity to be substantially identical to a direction of the aforementioned static magnetic field (and a direction of the application magnetic field) in the magnetic resonance member 1. For example, it is favorable that an angle (absolute value) between the aforementioned arrangement direction of the vacancy and the impurity and the aforementioned direction of the static magnetic field (and the direction of the application magnetic field) is equal to or less than 8 degrees and it is most favorable that the angle is 0 degree.

In this embodiment, as shown in FIGS. 4 to 6, in an end part of a L-shaped circuit substrate 31, the high-frequency magnetic field generator 2 is fixed; in the other end part of the circuit substrate 31, fixed is a connector 32 that is electrically connected to the high-frequency power supply 11 using a cable; and the connector 32 is electrically connected to both ends (the terminal parts 2b) of the high-frequency magnetic field generator 2 through a wiring pattern, electrical elements (resistor, capacitor and the like) for impedance matching and the like, a via hole and/or the like. In a view of downsizing of the whole apparatus, a semiconductor substrate 31 such a SiC substrate with high insulation performance may be used as the circuit substrate 31. Further, the magnetic resonance member 1 is arranged at a substantial center of the hollow part of the high-frequency magnetic field generator 2. Consequently, microwave having substantially uniform strength and a substantially uniform direction is applied to the magnetic resonance member 1.

Further, in this embodiment, the irradiating device 12 and the light receiving device 13 are installed as a detecting device that detects physical phenomena (here, fluorescence) corresponding to the aforementioned application magnetic field.

The irradiating device 12 irradiates the magnetic resonance member 1 as an optically detected magnetic resonance member with light (excitation light of a predetermined wavelength and measurement light of a predetermined wavelength) through the hollow part of the secondary coil 4b along Z direction in FIG. 6. Further, the light receiving device 13 receives and detects fluorescence emitted from the magnetic resonance member 1 through the hollow part of the secondary coil 4b in irradiation of the measurement light. In this embodiment, the irradiating device 12 irradiates the magnetic resonance member 1 with the aforementioned light along the aforementioned center axes. Consequently, the hollow part of the secondary coil 4b is an actual closed space, and secured is a space for a light path of laser light (the measurement light) from the irradiating device 12 and a light path of the fluorescence from the magnetic resonance member 1; and the measurement light and the fluorescence do not leak to an external space.

Further, as shown in FIGS. 5 and 6, for example, the magnetic resonance member 1 is fixed on a prism 41 of a quadrangular pillar shape, and the prism 41 is fixed to the bobbin 4b1 using a jig 42 such that the magnetic resonance member 1 is arranged at a substantial center of the hollow part of the high-frequency magnetic field generator 2. As shown in FIG. 5, the prism 41 has a reflection surface that is along X-axis direction and slanted in Y-Z plane (e.g. by 45 degrees), and reflects a part of the fluorescence emitted from the magnetic resonance member 1 by this reflection surface and causes the reflected part of fluorescence to exit to an opposite side to the excitation light and the measurement light.

This fluorescence is converged toward the light receiving device 13 by a compound paraboloid type condenser (CPC) 43 or the like as shown in FIG. 2, for example. The optical system that converges the fluorescence may have another lens configuration. Further, in this embodiment, an opening part facing the compound paraboloid type condenser (CPC) 43 is also formed on a side surface of the coil part of the high-frequency magnetic field generator 2, and a part of the fluorescence passes through this opening part and is also converged by the compound paraboloid type condenser (CPC) 43 or the like toward the light receiving device 13.

It should be noted that here the aforementioned physical phenomenon is optically detected, but may be change of an electric characteristic (resistance value change of the magnetic resonance member 1 or the like) and may be electrically detected.

Returning to FIG. 1, the processor 14 includes a computer, for example, and executes a program with the computer and thereby acts as sorts of processing units. In this embodiment, the processor 14 saves signal data detected optically or electrically into an unshown storage device (memory or the like), and performs control and execution operations as a measurement control unit 21 and a calculation unit 22.

The measurement control unit 21 controls the high-frequency power supply 11 and determines a detection value of the physical phenomenon (here, of intensities the fluorescence) detected by the aforementioned detecting device (here, the irradiating device 12 and the light receiving device 13).

In this embodiment, the measurement control unit 21 controls the high-frequency power supply 11 and the irradiating device 12 in accordance with a predetermined measurement sequence, for example, on the basis of ODMR, and determines a detection light intensity of the fluorescence detected by the light receiving device 13. For example, the irradiating device 12 includes a laser diode or the like as a light source, and the light receiving device 13 includes a photo diode or the like as a photodetector, and the measurement control unit 21 determines the aforementioned detection light intensity on the basis of an output signal of the light receiving device 13, and this output signal is obtained by amplification and/or the like of an output signal of the photodetector.

The calculation unit 22 calculates the measurement target magnetic field (intensity, wave form, or the like) at the aforementioned measurement position on the basis of the detection value obtained by the measurement control unit 21 and saved in the storage device.

It should be noted that the aforementioned measurement sequence is set in accordance with a frequency or the like of the measurement target magnetic field. For example, if the measurement target magnetic field is an AC (alternating current) magnetic field of a relatively high frequency, a Spin Echo sequence (Hahn Echo sequence) is applied as this measurement sequence. The measurement sequence is not limited to this. Further, for example, if the measurement target magnetic field is an AC magnetic field of a relatively low frequency, magnetic field measurement may be performed plural times in one period of the measurement target magnetic field in accordance with Ramsey pulse sequence (i.e. a measurement sequence for a DC (Direct Current) magnetic field), and the measurement target magnetic field (intensities, waveform or the like of it) may be determined on the basis of magnetic field measurement results.

Further, a magnetic shield is installed around the magnetic resonance member 1 of the magnetic sensor part 10, and thereby a magnetic field from outside is not directly applied to the magnetic resonance member 1.

The following part explains a behavior of the magnetic field measurement apparatus in this embodiment.

Figure 9:
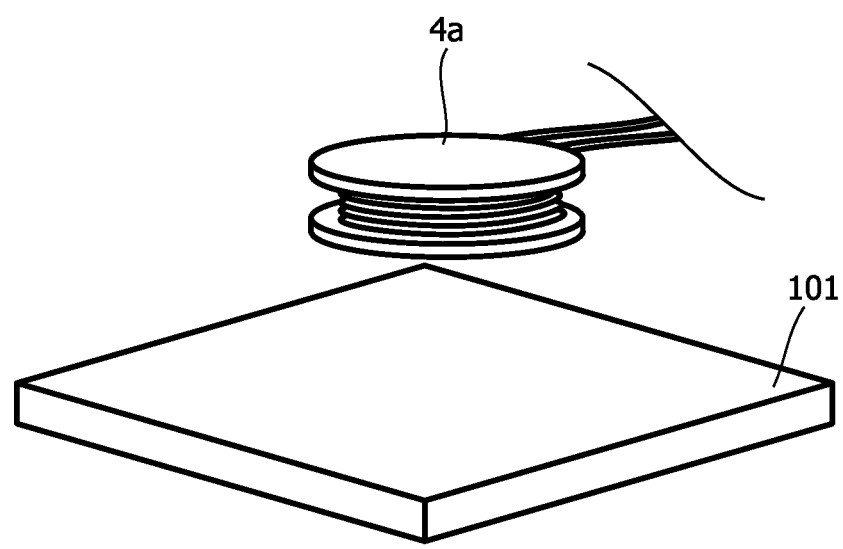
FIG. 9 shows a diagram that indicate a behavior of the magnetic field measurement apparatus.

As shown in FIG. 9, for a measurement target object 101, the primary coil 4*a* of the flux transformer 4 in the magnetic sensor part 10 is arranged at a desired measurement position and with a desired orientation. Consequently, a measurement target magnetic field is sensed by the primary coil 4*a*, and an application magnetic field is induced by the secondary coil 4*b* and is applied to the magnetic resonance member 1. In addition, a substantially uniform static magnetic field is applied to the magnetic resonance member 1 by the magnet 3 in the magnetic sensor part 10.

Further, the measurement control unit 21 controls the high-frequency power supply 11 and the irradiating device 12, and applies microwave and laser light (the excitation light and the measurement light) to the magnetic resonance member 1 at predetermined timings and with predetermined time lengths in accordance with a predetermined measurement sequence and acquires a detection value of the physical phenomena (here, a fluorescence strength obtained in the light receiving device 13) from the magnetic sensor part 10; and the calculation unit 22 performs calculation corresponding to the measurement sequence on the basis of the detection value and thereby determines the magnetic field (its intensity, its direction, and/or the like) at the measurement position.

Thus, a magnetic field is measured at a measurement position by the magnetic sensor part 10 (i.e. the magnetic resonance member 1). The magnetic sensor part 10 may be moved for scanning along a predetermined scanning path pattern and the aforementioned magnetic field measurement may be performed at plural measurement positions on the scanning path.

As mentioned, in the aforementioned embodiment, the high-frequency magnetic field generator 2 applies microwave to a magnetic resonance member 1 capable of an electron spin quantum operation using the microwave. The magnet 3 applies a static magnetic field to the magnetic resonance member 1. The irradiating device 12 irradiates the magnetic resonance member 1 with light of a specific wavelength. The flux transformer 4 senses a measurement target magnetic field using the primary coil 4*a* and an applies application magnetic field corresponding to the sensed measurement target magnetic field to the magnetic resonance member 1 using the secondary coil 4*b*. Further, the magnetic resonance member 1 is arranged at a position in a hollow part of the secondary coil 4*b* of the flux transformer 4 and in a hollow part of the magnet 3.

Consequently, without obstructing light paths of the aforementioned excitation light and the measurement light (and the fluorescence), a magnetic field corresponding to the measurement target magnetic field is enabled to be applied to the magnetic resonance member 1. Therefore, the flux transformer 4 effectively applies the magnetic field corresponding to the measurement target magnetic field to the magnetic resonance member 1 and enables the magnetic measurement. Further, the magnetic resonance member 1, the high-frequency generator 2, and the magnet 3 are easily arranged relatively to a direction of a magnetic flux of the flux transformer 4, and a space for irradiation of the laser light can be easily secured.

The following part explains a manufacturing method of the magnetic field measurement apparatus in this embodiment.

Firstly, the magnetic resonance member 1, the high-frequency magnetic field generator 2, the magnet 3 and the flux transformer 4 are prepared.

Subsequently, the high-frequency generator 2 is attached to the circuit substrate 31. Further, if a semiconductor substrate such as SiC is used in a view of downsizing, the high-frequency generator 2 is installed with the substrate as a single body.

Subsequently, the circuit substrate 31 to which the high-frequency generator 2 was attached, the magnetic resonance member 1, the prism 41, and the jig 42 are combined to each other. When combining, the combination is made such that the magnetic resonance member 1 is arranged at a center part of the high-frequency generator 2, and concurrently, the combination is made such that one of arrangement directions of the vacancy of the magnetic resonance member 1 gets toward the center of the opening part 2*c* of the high-frequency generator 2. Consequently, a magnetic flux generated by the high-frequency generator 2 gets perpendicular to at least one outer surface of the magnetic resonance member 1.

Further, a combined object that is configured of the high-frequency generator 2, the circuit substrate 31, the magnetic resonance member 1, the prism 41, and the jig 42 is inserted and fixed to the hollow part of the secondary coil 4*b* of the flux transformer 4. Here, this is performed such that the magnetic resonance member 1 is arranged in the center area and the center section of the secondary coil 4*b*. In addition, this is performed such that a center point of the opening part 2*c* of the high-frequency generator 2 is also arranged in the center area and the center section of the secondary coil 4*b*. Further, a direction and a position of each of the parts are adjusted such that the magnetic flux generated by the high-frequency generator 2 and the magnetic flux generated by the secondary coil 4*b* get perpendicular to each other.

Furthermore, the magnet 3 is attached in the outside of the secondary coil 4*b* of the flux transformer 4. Meanwhile, the irradiating device 12 is installed and fixed.

The flux transformer 4 and the magnet 3 may be combined in advance, and afterward, the combined flux transformer 4 and magnet 3 may be combined to a combined object that is configured of the high-frequency generator 2, the circuit substrate 31, the magnetic resonance member 1, the prism 41, and the jig 42.

According to the aforementioned manufacturing method, the magnetic resonance member 1, the high-frequency generator 2, and the magnet 3 can be stepwisely adjust for a direction of a magnetic flux of the flux transformer 4, this relative arrangement is easily done, and a complex adjustment after the combination is not required.

Further, it should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

For example, in the aforementioned embodiment, the secondary coil 4*b* is arranged in a hollow part of the magnet 3. Alternatively, the magnet 3 may be arranged in a hollow part of the secondary coil 4*b*.

Further, in the aforementioned embodiment, a thickness of a ring-type magnet as the magnet 3 may be identical to a thickness of the secondary coil 4*b* (or the bobbin 4*b*1).

Furthermore, in the aforementioned embodiment, the magnet 3 may be an electromagnet.

INDUSTRIAL APPLICABILITY

For example, the present invention is applicable to a magnetic field measurement apparatus and a magnetic field measurement method.

The invention claimed is:

1. A magnetic field measurement apparatus, comprising:
a magnetic resonance member for performing an electron spin quantum operation in response to application of a microwave to the magnetic resonance member;
a high-frequency magnetic field generator for applying the microwave to the magnetic resonance member;
a magnet for applying a static magnetic field to the magnetic resonance member;
an irradiating device for irradiating the magnetic resonance member with light of a specific wavelength; and
a flux transformer comprising a primary coil for sensing a measurement target magnetic field and a secondary coil electrically connected to the primary coil for applying an application magnetic field corresponding to the sensed measurement target magnetic field to the magnetic resonance member;
wherein the magnetic resonance member is arranged at a position in a hollow part of the secondary coil of the flux transformer and in a hollow part of the magnet.

2. The magnetic field measurement apparatus according to claim 1, wherein the magnet is a ring-type magnet;
the secondary coil is winded of a ring shape;
a center axis of the magnet and a center axis of the secondary coil are identical to each other; and
the magnetic resonance member is arranged on the center axes.

3. The magnetic field measurement apparatus according to claim 2, wherein in a direction of the center axes, the magnetic resonance member is arranged at a center of a width of the ring-type magnet.

4. The magnetic field measurement apparatus according to claim 3, wherein the irradiating device is configured to irradiate the magnetic resonance member with the light along the center axes.

5. The magnetic field measurement apparatus according to claim 2, wherein the irradiating device is configured to irradiate the magnetic resonance member with the light along the center axes.

6. The magnetic field measurement apparatus according to claim 1, wherein the magnetic resonance member comprises a color center for performing the electron spin quantum operation in response to the application of the microwave; and
the magnet is configured to apply a substantially uniform static magnetic field to the magnetic resonance member.

7. A magnetic field measurement method, comprising the steps of:
sensing a measurement target magnetic field using a primary coil of a flux transformer,
applying an application magnetic field to a magnetic resonance member using a secondary coil of the flux transformer that is electrically coupled to the primary coil, the magnetic resonance member for performing an electron spin quantum operation in response to application of a microwave, the application magnetic field corresponding to the sensed measurement target magnetic field;
applying the microwave to the magnetic resonance member;
applying a static magnetic field to the magnetic resonance member; and
irradiating the magnetic resonance member with light of a specific wavelength;
wherein the magnetic resonance member is arranged at a position in a hollow part of the secondary coil of the flux transformer and in a hollow part of the magnet.

* * * * *